United States Patent [19]

Lejon

[11] 4,215,340
[45] Jul. 29, 1980

[54] PROCESS FOR THE AUTOMATIC SIGNALLING OF FAULTS OF A STATIC AUTOMATIC MODULE AND A MODULE FOR REALIZING THE PROCESS

[75] Inventor: Jean Lejon, Choisel, France

[73] Assignee: Controle Bailey, Clamart, France

[21] Appl. No.: 887,469

[22] Filed: Mar. 17, 1978

[30] Foreign Application Priority Data

Apr. 1, 1977 [FR] France ................. 77 09909

[51] Int. Cl.² ............................................ G08B 29/00
[52] U.S. Cl. .................................... 340/507; 307/204;
340/653; 340/658; 340/508
[58] Field of Search ............... 340/507, 506, 509, 653,
340/658, 635, 508; 307/204

[56] References Cited

U.S. PATENT DOCUMENTS

| 2,922,147 | 1/1960 | Bredesen | 340/509 |
| 3,431,557 | 3/1969 | Thomas et al. | 340/653 |
| 3,467,956 | 9/1969 | Moreines | 340/658 |
| 3,492,589 | 1/1970 | Rotier | 340/507 |
| 3,588,857 | 6/1971 | Gessner et al. | 340/507 |

Primary Examiner—Glen R. Swann, III

[57] ABSTRACT

Process for the automatic signalling of faults of an automatic static safety module and a module realizing said process which can be used in automatic safety systems which can, for example, be used in nuclear reactors.

The module comprises at least one pair of identical parallel logic circuits each having a first positive continuous supply connection and a second negative supply connection. The circuit output can have one or other of two logic states depending on whether it is connected to the first or second connection. It comprises means for the automatic signalling of a fault in one module component constituted by a.c. voltage sources of different frequencies inserted in the supply connections. It also comprises means for detecting the presence of beats between the a.c. voltages appearing at the outputs of circuits and for indicating cases of non-agreement of the logic states.

10 Claims, 8 Drawing Figures

PROCESS FOR THE AUTOMATIC SIGNALLING OF FAULTS OF A STATIC AUTOMATIC MODULE AND A MODULE FOR REALIZING THE PROCESS

BACKGROUND OF THE INVENTION

The present invention relates to a process for the automatic signalling of faults of a static automatic module and a module for realising the process. It is utilised in the construction of automatic safety systems which can be used for controlling the satisfactory operation of certain equipment or installations, such as for example nuclear reactors.

An automatic safety unit receives data from sensors (for example thermocouples, radiation detectors, etc.) and controls the safety devices (for example valves, control rods, etc.) in such a way that if one of the parameters measured by the sensors passes out of the safety range assigned to it, the safety members are actuated to prevent any risk of an accident.

The term static automatic unit is generally understood to mean an automatic unit whose operation is based on stable logic states which can be assumed by the components thereof as opposed to so-called dynamic automatic units in which at least one of the states corresponds to a commutation from one state to another, for example, the commutation from the 0 state into a 1 state.

The module according to the present invention advantageously functions according to a so-called "summation increase logic." This means that the logic output signal is the arithmetic sum of the elementary signals supplied by the different logic channels. If there are, for example, four elementary logics in parallel distributed into two half-blocks of two logics each, the arithmetic sum of the four elementary signals is formed at the logic output. If three of the four signals are sufficient for maintaining the output summation logic state, a three/four redundancy is obtained.

When the first fault of a three/four redundancy summation logic system appears, nothing happens and the operating safety is ensured. However, it is indispensable to supplement such a system with fault signalling to enable it to be immediately remedied because a second fault could appear which on this occasion would cause an output logic fault.

It is possible to use a periodic test procedure for the elements of the system in order to check their satisfactory operation. However, this procedure is relativey little used because the test period must be short because the redundant elements being identical, the probability of successive faults in the early and late periods of the system is relatively great.

No matter what type of test device is used it must be infallible which is the cause of the high price of redundant systems. For a closer definition of the price it is necessary to assume as a basis the conventional undervoltage electromechanical relay which gives a modest degree of safety or security limited to the orientation of the most frequently occurring faults (the undervoltage controlling the safety action). The price of three/four redundancy systems with signalling of faults and the possibility of replacing the defective component without interrupting the operation of the complete system is about four to five times that of the electromechanical relay.

In the present invention consideration is given to automatic units having substantially the same performances (safety, fault signalling, possibility of fault clearance with system operating) but which lead to a lower price of the order of 1.6 to 2 times the price of an ordinary electromagnetic relay.

The price is much the same as that of validation and 2-redundancy systems in which a comparator validates the commands in the case of agreement and blocks them in the case of non-agreement, whereby said comparator is not generally redundant but is periodically checked. The system according to the invention, whose price is much the same, performs better than validation and 2-redundancy systems because it is equipped with automatic signalling means which have an absolute security.

BRIEF SUMMARY OF THE INVENTION

The problem of the present invention is therefore to reduce the price of automatic safety systems with equivalent performances or to increase the performances of said systems with an equivalent price.

According to the invention, this problem is solved by a static automatic module which in general comprises at least two parallel logic circuits having a first positive continuous supply connection and a second negative or zero continuous supply connection, whereby the output of each logic circuit can have one or other of the two logic states depending on whether it is connected to the first or second supply connection. According to the invention to obtain the auto-signalling of faults a.c. voltages of different frequencies are superimposed on the d.c. voltages, the presence of beats between the a.c. voltages appearing at the outputs is detected, and as a function of the presence or absence of said beats cases of non-agreement of the logic states of the circuits are signalled.

According to a simple preferred embodiment, a voltage of frequency $F_1$ for the first circuit and a voltage of frequency $F_2$ for the second circuit are superimposed on the positive power supplies, a voltage of frequency $F_2$ for the first circuit and a voltage of frequency $F_1$ for the second circuit are superimposed on the negative power supplies, the presence of a beat between the said two frequencies between the outputs of the two logic circuits is detected and a satisfactory operation signal is emitted when the said beat is present, any failure of a module component being indicated by the absence of said satisfactory operation signal.

According to a more complex embodiment it is possible to use four voltages of different frequencies, $F_1$, $F_2$, $F_3$ and $F_4$, and deduce the cases of failure from the presence or absence of beats at the different frequencies.

The invention also relates to a static automatic safety module for realising the process described hereinbefore and which comprises at least two parallel identical logic circuits, each circuit having a first positive continuous supply connection and a second negative supply connection, whereby the output of said circuit can have one or other of the two logic states as a function of whether it is connected to the first or second supply connection. This module also comprises means for the automatic signalling of a failure of a component of the module, said means being constituted by a.c. voltage sources of different frequencies inserted in said supply connections, and means for detecting the presence of beats between the a.c. voltages which appear at the outputs of the circuits and for indicating cases of non-agreement of the logic states as a function of the presence or absence of said beats.

According to a preferred embodiment, the module comprises in the positive supply connections an a.c. voltage source of frequency $F_1$ for the first circuit and another source of frequency $F_2$ for the second circuit, and in the negative supply connections an a.c. voltage source of frequency $F_2$ for the first circuit and another source of frequency $F_1$ for the second circuit, whereby the beat detection circuit is able to detect the presence of a beat between the said two frequencies between the outputs of the two logic circuits and to control means for emitting a satisfactory operation signal when said beat is present, any failure of a component of the module being indicated by the absence of said satisfactory operation signal.

Finally, the invention relates to a ¾-redundancy static safety automatic unit with a summation increase logic and automatic signalling of faults, wherein it comprises two modules of the type defined hereinbefore connected in parallel.

BRIEF DESCRIPTION OF THE DRAWINGS

The features and advantages of the present invention will be better understood from the following description of non-limitative embodiments with reference to the attached drawings wherein show.

DETAILED DESCRIPTION OF THE PREFERRED EMBODIMENTS

Figure 1:
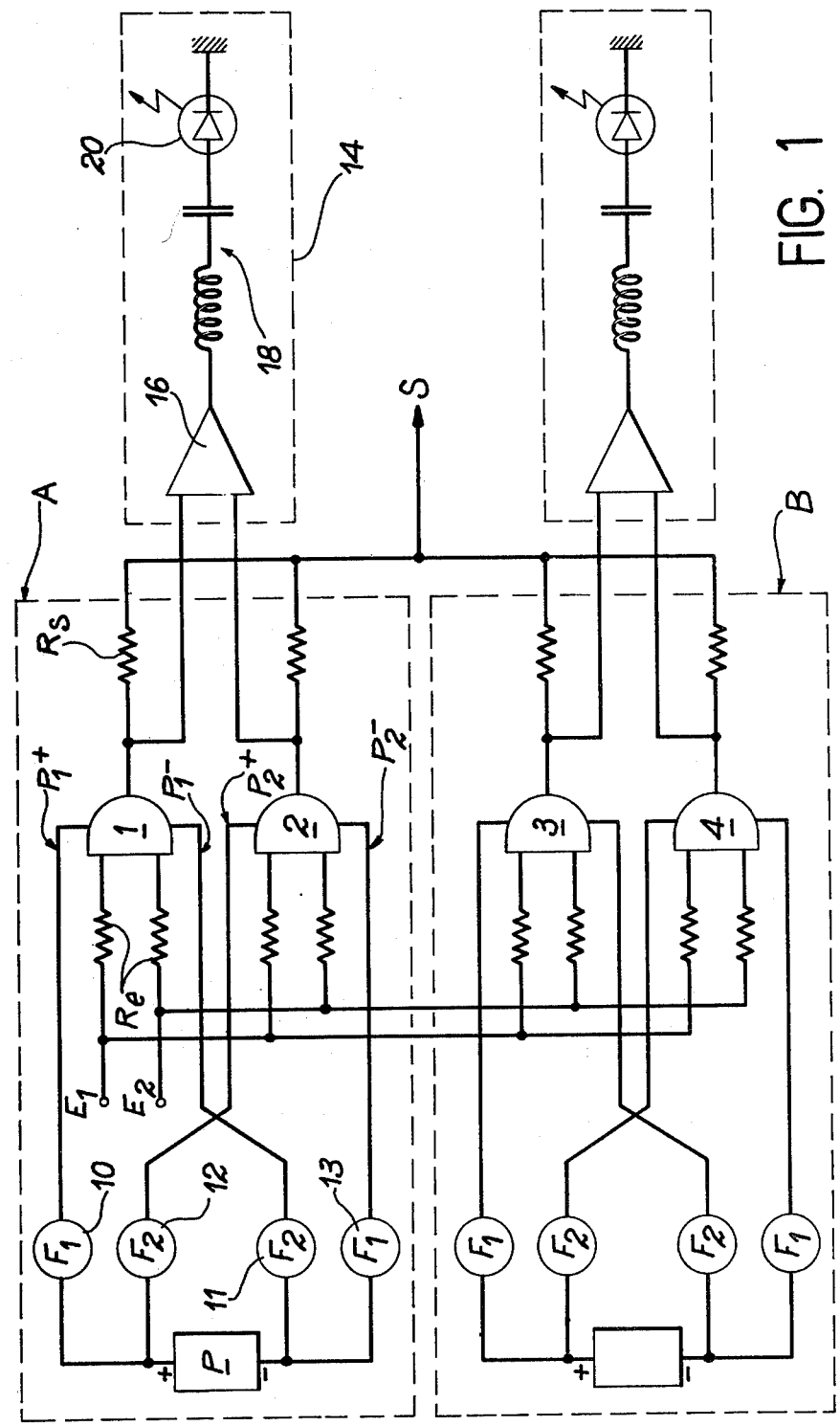
FIG. 1, a block diagram of a circuit according to the invention with two modules and a summation increase logic in the case where the logic circuits are AND gates.

The principle of the process and module according to the invention can be explained with reference to FIG. 1 in the special non-limitative case where the logic circuits used fulfil the basic AND function. Obviously the invention is not limited to this one case and it is possible to use in the same way circuits fulfilling other functions such as OR memory, timing, reversal, input, output etc.

In the case of a ¾-redundancy summation logic circuit four lines (in this case four AND gates) are used in parallel and their outputs are connected. These gates carry the reference numerals 1, 2, 3, 4. Their inputs are connected to signal inputs $E_1$ and $E_2$ and their outputs to the single output S. The system is sub-divided into two half-blocks A and B which are identical in the case of a ¾-redundancy circuit but it is obvious that only one of the two half-blocks need be used to obtain a 2-redundancy.

In this case the failure of one component may cause a false logic state, whereby only the instantaneous detection of this probability of a false state is effected by the beat system with a view to controlling, for example, a validation device.

As all the gates of the circuit of FIG. 1 are identical, it is merely necessary to describe one, for example, gate 1. Its two inputs are connected at $E_1$ and $E_2$ by two identical resistors $R_e$ and its single output S is connected by a resistor $R_s$. Gate 1 has two supply connections, the first $P_1+$ being connected to the positive pole of the d.c. voltage source P and the second $P_1-$ being connected to the negative pole of the same source. According to the invention, a first a.c. voltage source 10 of frequency $F_1$ is positioned on connection $P_1+$ and a second a.c. voltage source 11 of frequency $F_2$ is placed on the connection $P_1-$. It is assumed hereinafter that $F_1$ is greater than $F_2$.

Gate 2 is identical except that the a.c. voltage sources are arranged symmetrically, that is to say source 12 is positioned on connection $P_2+$ at a frequency $F_2$ and source 13 on connection $P_2-$ at a frequency $F_1$.

The a.c. voltage sources can comprise an oscillator disposed, for example, in the primary of a transformer whose secondary in series with the supply connection.

Between the outputs of the two gates 1 and 2 is provided a circuit 14 which is able to detect the presence of a signal at the beat frequency f between $F_1$ and $F_2$, for example $F_1-F_2$. In the illustrated variant this circuit comprises an amplifier detector 16 and a circuit 18 adjusted to the beat frequency f and controlling a control signal emission means 20 which may comprise a light signal, for example, an electroluminescent diode.

Half-block B is identical to half-block A.

Module A functions in the following manner. The two logic states which can appear at the output of each of the gates 1 and 2 correspond to the two cases where the output of the gate is connected either to the positive supply connection or to the negative supply connection. In other words, the voltage appearing at the output of the gate is one or other of the voltages appearing on the supply connections. Hereinafter it is stated that the output is at state 1 when the voltage is positive and that it is at state 0 when the voltage is negative. Obviously one of the voltages may be 0.

As the d.c. voltages are modulated by the a.c. voltages superimposed thereon, said a.c. voltages occur at the output of the gates. Thus, if the logic states of gates 1 and 2 are identical, signals modulated respectively at frequencies $F_1$ and $F_2$ if the state is 1 and modulated at frequencies $F_2$ and $F_1$ if the state is 0 are collected at the outputs of said gates. In all cases only the agreement of the logic states leads to the simultaneous appearance of frequencies $F_1$ and $F_2$ between the two outputs.

Amplifier detector 16 then effects the beat between the two frequencies and controls diode 20 across circuit 18 adjusted, for example, to frequency $f=F_1-F_2$. A fault of any type to this detector leads to a disappearance of the beat and in no case is there an undesired beat. From the detection standpoint the safety and reliability is absolute.

Figure 2:
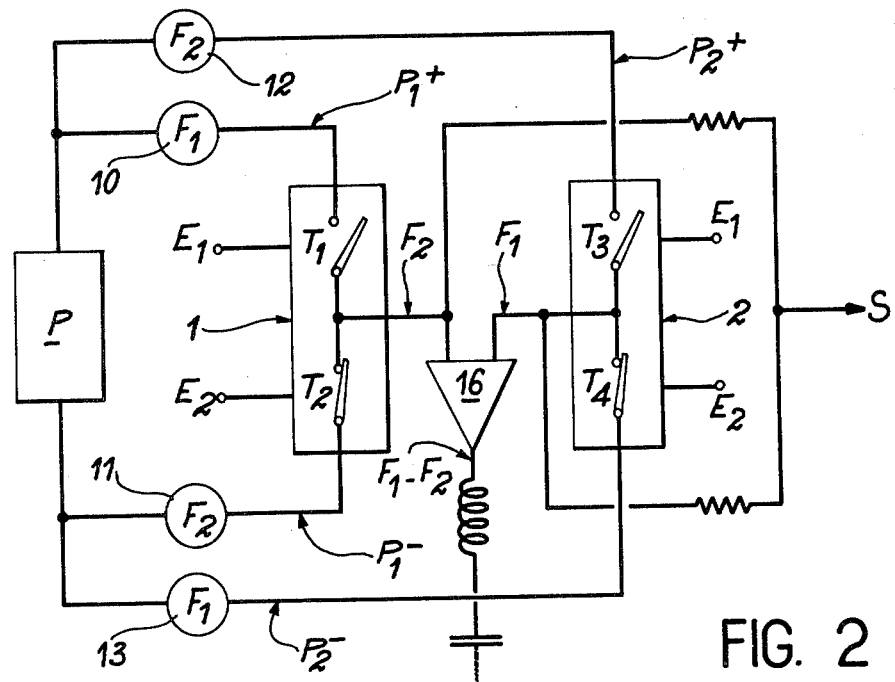
FIG. 2, diagrammatically the state of the components of the module of FIG. 1 when in the 0 state.
Figure 3:
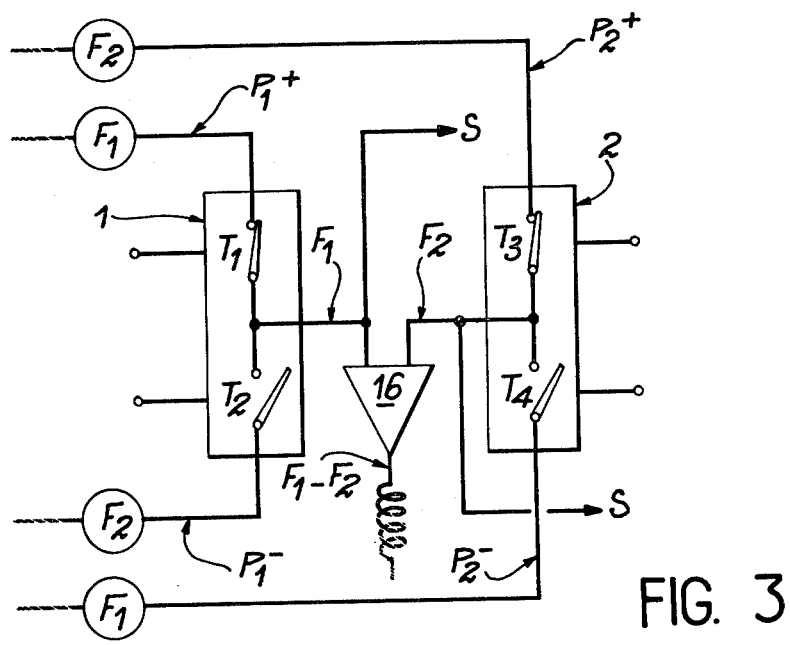
FIG. 3, diagrammatically the state of the components of the same module when in the 1 state.
Figure 8:
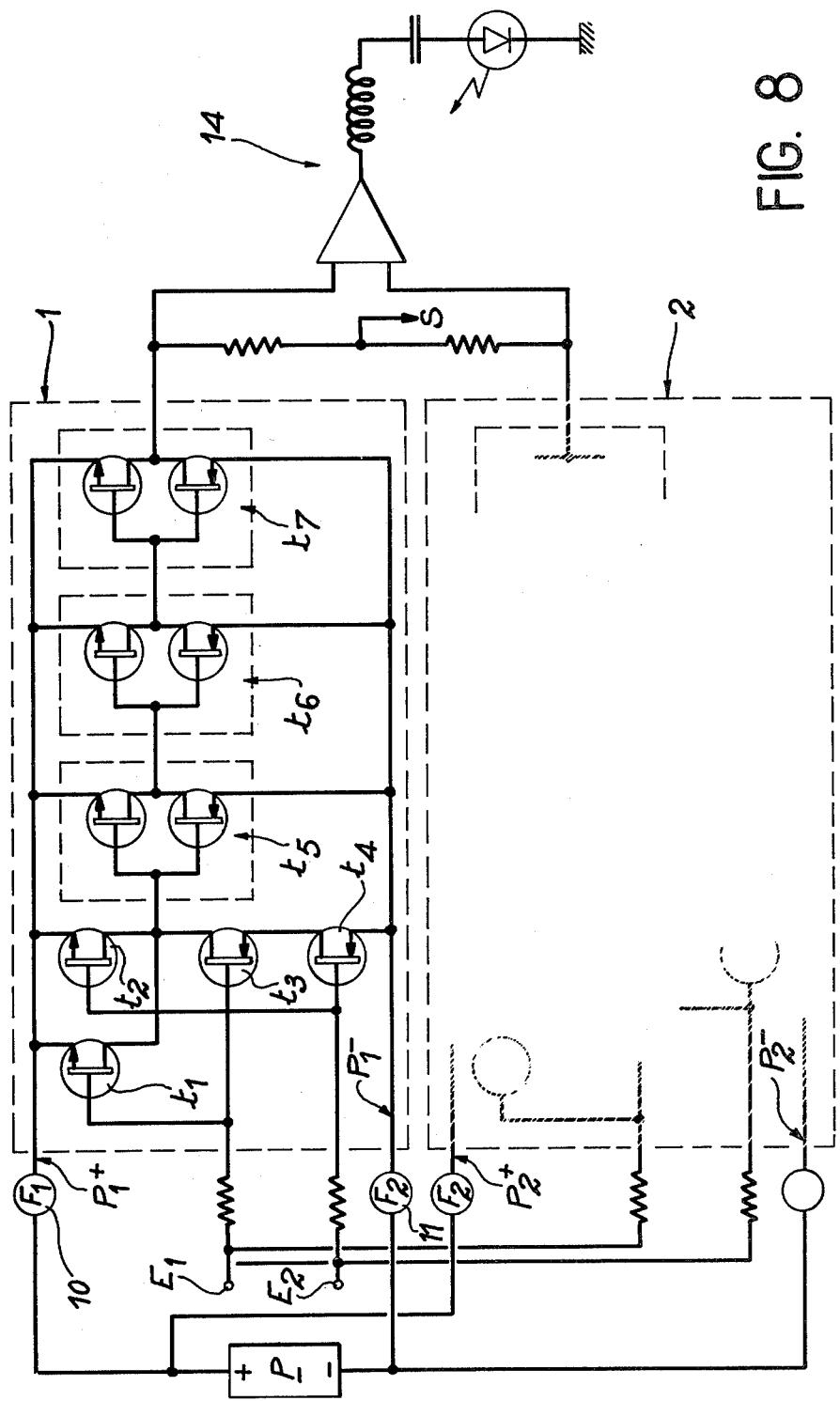
FIG. 8, the construction of a module according to the invention using C/MOS transistors.

FIGS. 2 and 3 show in greater detail the configuration of the gate circuits in the case, for example, where the gates comprise C/MOS transistors. As is known, this involves a metal oxide semiconductor technology using pairs of transistors of complementary types, that is to say whose channel is of the p type in some cases and of the n type in other cases. A precise example of such gates is illustrated in FIG. 8.

In the case in question an AND gate is diagrammatically reduced to a pair of transistors connecting the output of the gate to each of the supply connections, whereby one of the transistors is conductive and the other is non-conductive and vice versa. The state of the transistors is imposed by the input signals. In the case of C/MOS transistors a conductive state substantially corresponds to a resistance of 300 ohms and a non-conductive state to a resistance of the order of $10^{11}$ ohms. In FIGS. 2 and 3 the transistors which constitute gates 1 and 2 are respectively designated by $T_1$ and $T_2$ for the first and $T_3$ and $T_4$ for the second, and are diagrammatically shown as switches.

FIG. 2 represents the state of the transistors when the outputs of the gates are in the 0 state and FIG. 3 the state of the same transistors when the outputs are in the 1 state. It is obvious that in both cases circuit 14 detects and indicates the beat at frequency $F_1-F_2$.

In all cases of changing the logic state of the output of one gate, detection is carried out correctly by the pairwise comparison of the outputs, no possible ambiguity being possible.

This arrangement has the double advantage of simplicity and permitting the autonomous operation of each module or half-block, making it possible to replace a single defective module in the system which uses a plurality thereof in parallel without interrupting the operation of said system.

Figure 4:
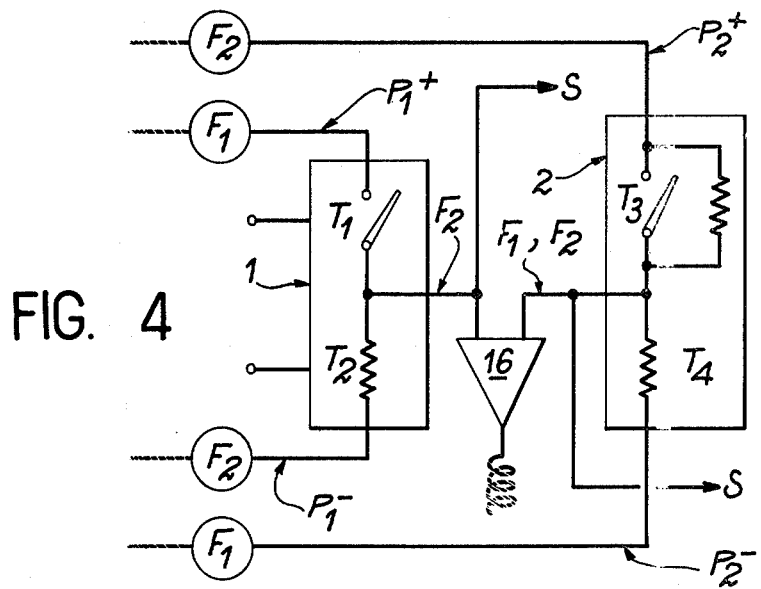
FIG. 4, diagrammatically the state of the same module in the least favourable state from the safety standpoint.

However, an unfavourable case can be imagined where one of the transistors is short-circuited and has a resistance of 300 ohms, i.e. the least favourable value, whilst it should be open and have a resistance of $10^{11}$ ohms. The situation is that shown in FIG. 4 which uses the same notations as in FIGS. 2 and 3. The gates are in the 0 state but transistor $T_3$ of gate 2 has a short-circuit of 300 ohms which is precisely the resistance value of transistor $T_4$. Detector 16 receives the two frequencies $F_1$ and $F_2$: frequency $F_2$ by $T_2$ but also by $T_3$ but with half the amplitude due to the two identical resistances $T_3$, $T_4$. As these two signals at frequency $F_2$ are applied to two different inputs of amplifier detector 16 the effective amplitude of the signal at frequency $F_2$ is divided by 2. The signal at frequency $F_1$ is transmitted to detector amplifier 16 by $T_4$ but the presence of $T_3$ reduces its amplitude by half.

It is therefore readily apparent that in this unfavourable case the alternating signals have their amplitude reduced by half, so that the beat signal also has its amplitude reduced by half enabling the unambiguous detection of the failure of a particular module using, for example, a threshold circuit.

Figure 5:
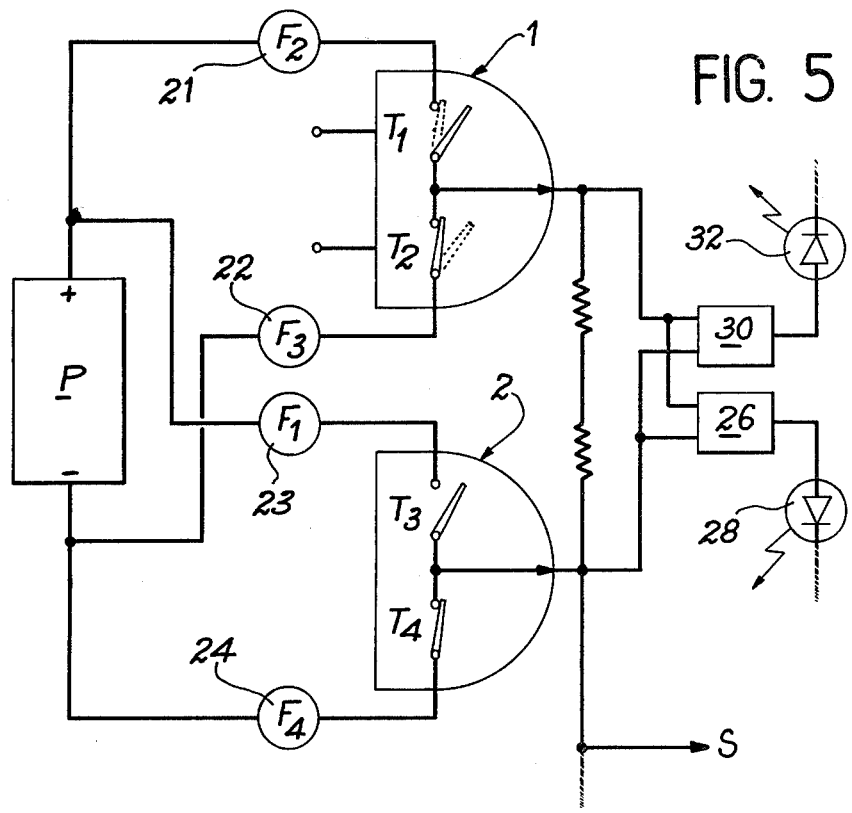
FIG. 5, diagrammatically the construction of a module using four alternating signals of different frequencies.
Figure 6:
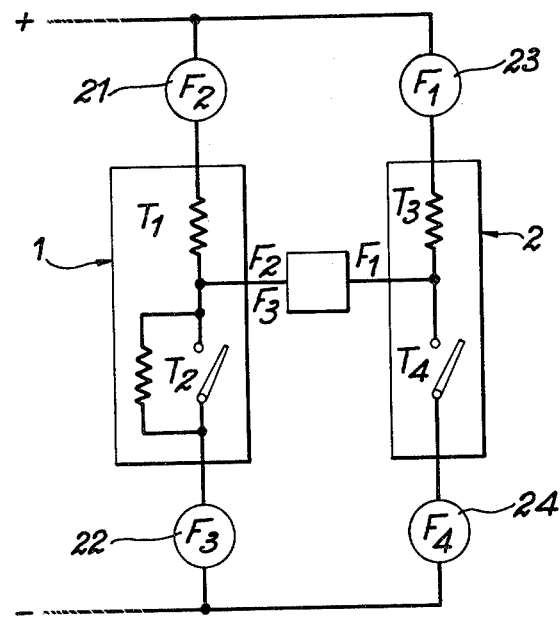
FIG. 6, the state of the circuit of FIG. 5 in the least favourable case of a short circuit on one of the transistors.
Figure 7:
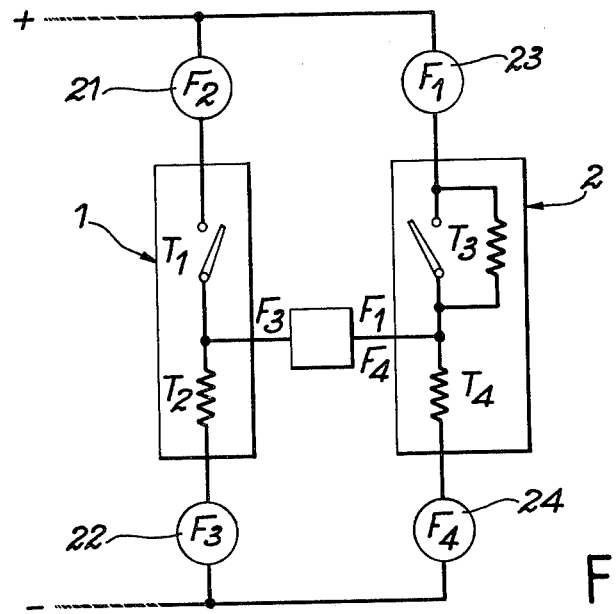
FIG 7, the state of the same circuit in another unfavourable case of a short circuit on another transistor.

If any type of detection problem occurs in a case of this type it would always be possible according to the invention to use a system with four frequencies instead of two as is illustrated in FIGS. 5 to 7.

In FIG. 5 a module with two AND gates 1 and 2 comprises four a.c. voltage generators 21, 22, 23, 24 of respective frequencies $F_2$, $F_3$, $F_1$, $F_4$. In the case of agreement of state 0 the beat of frequencies $F_3$ and $F_4$ is detected and in the case of agreement of state 1 the beat of frequencies $F_1$ and $F_2$ is detected. It is then advantageously possible to select said frequencies so that $F_1-F_2=F_3-F_4$, in which case the agreement of logic state, as in the simplified variant of FIG. 1, leads to a beat at the common frequency $f=F_1-F_2=F_3-F_4$. However, in the case of a short circuit fault a different beat frequency appears which can be used to inhibit signalling of the beat at frequency f or for signalling the presence of said beat which indicates a failure fault. Thus, the beat detection circuit comprises a first detection circuit 26 regulated at frequency f and controlling diode 28 and a second detection circuit 30 regulated at another frequency ($F_1-F_3$, $F_2-F_3$, $F_1-F_4$ or $F_2-F_4$), said circuit controlling a second diode 32 which signals the presence of a fault or inhibits the control of diode 28.

For example, it is possible to use the following group of frequencies expressed in kHz: $F_1=120$, $F_2=100$, $F_3=60$ and $F_4=40$, for which the beats appear at frequencies: $F_1-F_2=20$, $F_1-F_3=60$, $F_2-F_3=40$, $F_2-F_4=60$, $F_3-F_4=20$, $F_1-F_4=80$.

The beat at 20 kHz is the satisfactory operation beat and that at 60 kHz the short circuit beat as can be seen in FIGS. 6 and 7 which show the influence of a short circuit of transistor $T_2$ when the logic state is 1 and transistor $T_3$ when the logic state is 0.

In the first case the beats which appear are at frequencies 20 kHz (correct beat which must be inhibited), 60 kHz (inhibition beat) and 40 kHz (beat which has no effect). In the second case the beats are at frequencies 60 Hz (inhibition), 20 kHz (to be inhibited) and 80 kHz (no effect).

FIG. 8 represents the true construction of a module according to the invention, once again with an AND function and using C/MOS technology. Such a construction is known with respect to the nature and distribution of the transistors and the invention relates to the improvement by adding alternating sources and beat detection means.

The two gates 1 and 2 are identical and it is merely necessary to describe one, gate 1 for example, which is shown in detail in the upper part. It comprises C/MOS transistors, $t_1$, $t_2$, $t_3$, $t_4$, the first two having a p channel and arranged in parallel on the positive supply connection $P_1+$ and the two latter having an n channel being mounted in series and connected to the negative supply connection $P_1-$. The input signals are applied to the gates of transistors $t_3$ and $t_4$.

This in itself constitutes a NAND gate and in order to obtain an AND gate it is merely necessary to add a NO circuit constituted in this case by three inverters $t_5$, $t_6$, $t_7$ having two complementary transistors one with a p channel and the other with an n channel.

Conenctions $P_1+$ and $P_1-$ are connected to a d.c. voltage source p via a.c. voltage sources 10 and 11 of frequencies $F_1$ and $F_2$ respectively.

Gate 2 is identical but the arrangement of the a.c. voltage sources is symmetrical. Frequency source $F_2$ is arranged in connection $P_2+$ and frequency source $F_1$ in connection $P_2-$.

The module is completed by beat detection circuit 14 which is connected between the two outputs of the gates.

To obtain a ¾-redundancy system with a summation logic, it is merely necessary to arrange a second module identical to that of FIG. 8 in parallel and to join the four outputs.

Any internal short-circuit or break to such a circuit can only lead to an undesired logic change $1-0$ or $0-1$ which is indicated by the disappearance of the light signal emitted by means 14. A progressive change of state is extremely unlikely except in the case of the last pair of transistors $t_7$ for which the least favourable case is the short-circuit of one of the two transistors at the precise value of the other conductive transistor, said case having been considered and solved hereinbefore.

The invention is not limited to the embodiments described and represented hereinbefore and various modifications can be made thereto without passing beyond the scope of the invention.

What is claimed is:

1. A process for the automatic signalling of faults of an automatic static safety module comprising at least one pair of identical parallel logic circuits and having a first positive continuous supply connection and a second negative continuous supply connection, whereby the output of each logic circuit can have one or another of two logic states depending on whether it is connected to the first or second supply connection, wherein a.c. voltages of different frequencies are superimposed on the d.c. voltages, the presence of beats between the a.c. voltages appearing at the outputs is detected, and as a function of the presence or absence of said beats cases of non-agreement of the logic states of the circuits are signalled.

2. A process according to claim 1, wherein a voltage of frequency $F_1$ for the first circuit and a voltage of frequency $F_2$ for the second circuit are superimposed on the positive power supplies, a voltage of frequency $F_2$ for the first circuit and a voltage of frequency $F_1$ for the second circuit are superimposed on the negative power supplies, the presence of a beat at the said two frequencies between the outputs of the two logic circuits is detected and a satisfactory operation signal is emitted when the said beat is present, any failure of a module component being indicated by the absence of said satisfactory operation signal.

3. A process according to claim 1, wherein a voltage of frequency $F_2$ for the first circuit and a voltage of frequency $F_1$ for the second circuit is superimposed on the positive supplies and a voltage of frequency $F_3$ for the first circuit and a voltage of frequency $F_4$ for the second circuit with $F_1-F_2=F_3-F_4=f$ is superimposed on the negative supplies and wherein the presence of a beat at frequency f at the outputs of the two logic circuits and the presence of other beats at different frequencies are detected and a satisfactory operation signal is emitted when only said beat at frequency f is present, any failure of a component of the module being indicated by the absence of said satisfactory operation signal.

4. An automatic static safety module realising the process of claim 1 of the type comprising at least one pair of parallel identical logic circuits, each circuit having a first positive continuous supply connection and a second negative continuous supply connection, the output of the circuit having one or another of two logic states depending on whether it is connected to the first or second supply connection, wherein it also comprises means for the automatic signalling of a failure of a component of the module, said means being constituted by a.c. voltage sources of different frequencies inserted in said supply connections, and means for detecting the presence of beats between the a.c. voltages which appear at the outputs of the circuits and for indicating cases of non-agreement of the logic states as a function of the presence or absence of said beats.

5. A module according to claim 4, comprising in the positive supply connections an a.c. voltage source of frequency $F_1$ for the first circuit and another source of frequency $F_2$ for the second circuit, and in the negative supply connections an a.c. voltage source of frequency $F_2$ for the first circuit and another source of frequency $F_1$ for the second circuit, whereby the beat detection circuit is able to detect the presence of a beat at the said two frequencies between the outputs of the two logic circuits and to control means for emitting a satisfactory operation signal when said beat is present, any failure of a component of the module being indicated by the absence of said satisfactory operation signal.

6. A module according to claim 4, comprising in the positive supply connections an a.c. voltage source of frequency $F_2$ for the first circuit and another source of frequency $F_1$ for the second circuit, and in the negative supply connections an a.c. voltage source of frequency $F_3$ for the first circuit and another source of frequency $F_4$ for the second, with $F_1-F_2=F_3-F_4=f$, said beat detection circuit being able to detect the presence of a beat at frequency f at the outputs of the two logic circuits and the presence of other beats at different frequencies and to control a satisfactory operation signal emission means when only the beat of frequency f is present, any failure of a component of the module being indicated by the absence of the satisfactory operation signal.

7. A module according to claim 5, wherein the beat detection circuit comprises an amplifier detector having the inputs connected to two outputs of the two logic circuits and one output connected to a circuit adjusted to the beat frequency f, said circuit controlling a satisfactory operation signal emission means.

8. A module according to claim 7, wherein the satisfactory operation signal emission means is an electroluminescent diode.

9. A module according to claim 5, wherein the logic circuits are constructed according to C/MOS technology.

10. A ¾-redundancy static safety automatic unit with summation increase logic and automatic signalling of faults wherein it comprises two modules according to any one of the claims 4 to 9 arranged in parallel.

* * * * *